United States Patent
Schmalz et al.

(10) Patent No.: US 8,725,142 B1
(45) Date of Patent: May 13, 2014

(54) CHANNEL SCANNING METHOD AND APPARATUS

(75) Inventors: Joachim Schmalz, Bischweier (DE); Olaf Mater, Eggenstein-Leopoldshafen (DE)

(73) Assignee: Marvell International Ltd., Hamilton (BM)

( * ) Notice: Subject to any disclaimer, the term of this patent is extended or adjusted under 35 U.S.C. 154(b) by 1560 days.

(21) Appl. No.: 11/926,835

(22) Filed: Oct. 29, 2007

Related U.S. Application Data

(60) Provisional application No. 60/863,676, filed on Oct. 31, 2006.

(51) Int. Cl.
*H04W 4/00* (2009.01)

(52) U.S. Cl.
USPC ............................ 455/434; 370/338; 370/328

(58) Field of Classification Search
CPC ...... H04W 48/16; H04W 48/20; H04W 84/12
USPC .................................. 455/434; 370/328, 338
See application file for complete search history.

(56) References Cited

U.S. PATENT DOCUMENTS

| | | | | |
|---|---|---|---|---|
| 5,987,062 A * | 11/1999 | Engwer et al. | ................ | 375/225 |
| 6,778,827 B1 * | 8/2004 | Anderson et al. | ............ | 455/434 |
| 7,050,802 B2 * | 5/2006 | Dent | .............................. | 455/434 |
| 7,069,577 B2 * | 6/2006 | Geile et al. | ..................... | 725/106 |
| 7,289,056 B2 * | 10/2007 | Liu et al. | ......................... | 342/52 |
| 7,359,676 B2 * | 4/2008 | Hrastar | ...................... | 455/67.11 |
| 7,366,169 B1 * | 4/2008 | Backes et al. | ................. | 370/389 |
| 7,415,278 B2 * | 8/2008 | Zhao et al. | .................... | 455/447 |
| 7,554,962 B2 * | 6/2009 | Takeuchi | ...................... | 370/338 |
| 2002/0098819 A1 * | 7/2002 | Phang et al. | .................. | 455/260 |
| 2003/0139197 A1 * | 7/2003 | Kostic et al. | .................. | 455/525 |
| 2004/0209617 A1 * | 10/2004 | Hrastar | ....................... | 455/434 |
| 2006/0142004 A1 * | 6/2006 | He et al. | ........................ | 455/434 |
| 2006/0142034 A1 * | 6/2006 | Wentink et al. | ............... | 455/515 |
| 2006/0189311 A1 * | 8/2006 | Cromer et al. | ................ | 455/434 |
| 2006/0209753 A1 * | 9/2006 | Patel | ............................ | 370/329 |
| 2006/0215627 A1 * | 9/2006 | Waxman | ....................... | 370/347 |
| 2007/0238426 A1 * | 10/2007 | Ginzburg et al. | .......... | 455/168.1 |
| 2007/0264935 A1 * | 11/2007 | Mohebbi | ...................... | 455/41.2 |
| 2007/0288157 A1 * | 12/2007 | Peterman | ..................... | 701/207 |
| 2008/0008121 A1 * | 1/2008 | Alizadeh-Shabdiz | ........ | 370/328 |
| 2008/0070523 A1 * | 3/2008 | Masri et al. | ................. | 455/161.1 |
| 2009/0005019 A1 * | 1/2009 | Patel et al. | ................. | 455/414.2 |

OTHER PUBLICATIONS

Ramani et al., "SyncScan: Practical Fast Handoff for 802.11 Infrastructure Networks," Prof. of IEEE Infocom Conf., Miami, FL Mar. 2005.

* cited by examiner

*Primary Examiner* — Christopher M Brandt

(57) ABSTRACT

A receiver is tuned to a first channel in a plurality of channels, and at least one beacon signal from at least one other channel is received while the receiver is tuned to the first channel. The at least one other channel is determined to be active based on the at least one beacon signal received while the receiver is tuned to the first channel. A channel that is determined to be "active" may be, for example, a communication channel on which an access point in a communication network is communicating or is able to communicate.

20 Claims, 7 Drawing Sheets

CHANNEL SCANNING METHOD AND APPARATUS

CROSS-REFERENCES TO RELATED APPLICATIONS

The present application claims the benefit of U.S. Provisional Application No. 60/863,676, entitled "WIDEBAND SCANNING," filed on Oct. 31, 2006, which is hereby incorporated by reference herein in its entirety.

FIELD OF TECHNOLOGY

The present disclosure relates generally to communication systems, and more particularly, to wireless communication systems that utilize multiple communication channels.

DESCRIPTION OF THE RELATED ART

An ever-increasing number of relatively cheap, low power wireless data communication services, networks and devices have been made available over the past number of years, promising near wire speed transmission and reliability. Various wireless technologies are described in detail in the 802.11 IEEE Standard, including for example, the IEEE Standard 802.11 (1999) and its updates and amendments, the IEEE Standard 802.11a/g (2003), as well as the IEEE Standard 802.11n now in the process of being adopted, all of which are collectively incorporated herein fully by reference. These standards have been or are in the process of being commercialized with the promise of 54 Mbps or more effective bandwidth, making them a strong competitor to traditional wired Ethernet and the more ubiquitous "802.11b" or "WiFi" 11 Mbps mobile wireless transmission standard.

Generally speaking, transmission systems compliant with the IEEE 802.11a and 802.11g or "802.11a/g" as well as the 802.11n standards achieve their high data transmission rates using Orthogonal Frequency Division Modulation or OFDM encoded symbols mapped up to a 64 quadrature amplitude modulation (QAM) multi-carrier constellation. In a general sense, the use of OFDM divides the overall system bandwidth into a number of frequency sub-bands or channels, with each frequency sub-band being associated with a respective sub-carrier upon which data may be modulated. Thus, each frequency sub-band of the OFDM system may be viewed as an independent transmission channel within which to send data, thereby increasing the overall throughput or transmission rate of the communication system.

Transmitters used in the wireless communication systems that are compliant with the aforementioned 802.11a/802.11g/802.11n standards as well as other standards such as the 802.16a/d/e/m IEEE Standards, typically perform multi-carrier OFDM symbol encoding (which may include error correction encoding and interleaving), convert the encoded symbols into the time domain using Inverse Fast Fourier Transform (IFFT) techniques, and perform digital to analog conversion and conventional radio frequency (RF) upconversion on the signals. These transmitters then transmit the modulated and upconverted signals after appropriate power amplification to one or more receivers, resulting in a relatively high-speed time domain signal with a large peak-to-average ratio (PAR).

Likewise, the receivers used in the wireless communication systems that are compliant with the aforementioned 802.11a/802.11g/802.11n and 802.16a IEEE standards typically include an RF receiving unit that performs RF down-conversion and filtering of the received signals (which may be performed in one or more stages), and a baseband processor unit that processes the OFDM encoded symbols bearing the data of interest. The digital form of each OFDM symbol presented in the frequency domain is recovered after baseband downconverting, conventional analog to digital conversion and Fast Fourier Transformation of the received time domain analog signal. Thereafter, the baseband processor performs demodulation (phase rotation) and frequency domain equalization (FEQ) to recover the transmitted symbols, and these symbols are then processed in a Viterbi decoder to estimate or determine the most likely identity of the transmitted symbol. The recovered and recognized stream of symbols is then decoded, which may include deinterleaving and error correction using any of a number of known error correction techniques, to produce a set of recovered signals corresponding to the original signals transmitted by the transmitter.

In the aforementioned 802.11a/802.11g/802.11n and 802.16a IEEE standards, a radio frequency spectrum is partitioned into a plurality of channels so that different information signals may be transmitted on the different channels. In such systems, an information signal is shifted to its RF channel for transmission. Each RF channel may be defined by its center frequency and its bandwidth or its upper and lower frequencies, for example. In some systems, each channel may be assigned a number or some other identifier so that the channels may be referred to more easily.

When a communication device for use in such a system powers up in an already existing wireless network, it may attempt to find a wireless access point and determine on which channel it may communicate with the access point. To facilitate the discovery of access points, an access point periodically may transmit a signal often referred to as a beacon to let other communication devices know of its presence. The beacon will include various information including a channel number to indicate which channel it is using.

When a communication device seeks to establish a connection with an access point, it may scan each channel in the wireless network system for beacons. Scanning for beacons includes tuning to each of the channels of the system and listening for beacons for some period of time at each channel. For example, if there are fourteen channels and it is assumed that beacons are transmitted at 100 millisecond (ms) intervals, the communication device may listen for beacons for approximately 100 ms at each channel. Thus, the communication device may spend 1.4 seconds (100 ms/channel×14 channels) scanning for beacons.

SUMMARY OF THE DISCLOSURE

In one embodiment, a method comprises tuning a receiver to a first channel in a plurality of channels, and receiving at least one beacon signal from at least one other channel while the receiver is tuned to the first channel. The method also comprises determining that the at least one other channel is active based on the at least one beacon signal received while the receiver is tuned to the first channel. A channel that is "active," as the term is used herein, may refer to a communication channel on which an access point in a communication network is communicating or is able to communicate. More broadly, channel that is "active," as the term is used herein, may refer to a communication channel on which beacons are being transmitted.

In another embodiment, a method comprises tuning a receiver to a first channel, the first channel in a first subset of channels, and scanning the first subset of channels for one or more beacon signals while the receiver is tuned to the first channel. The method additionally comprises tuning the receiver to a second channel, the second channel in a second subset of channels different than the first subset of channels, and scanning the second subset of channels for one or more beacon signals while the receiver is tuned to the second channel.

In yet another embodiment, in which a multi-channel communication system has N communication channels, wherein N is a positive integer greater than two, a method for searching for active channels, comprises tuning a receiver to each of M communication channels, wherein M is less than N. The method also comprises scanning all N communication channels for one or more beacon signals without tuning the receiver to all N communication channels.

In still another embodiment, a communication device comprises a radio frequency (RF) receiver having a filter. The device also comprises a controller coupled to the RF receiver. The controller causes the receiver to be tuned to a first channel in a plurality of channels, detects at least one beacon signal from at least one other channel while the receiver is tuned to the first channel, the at least one other channel falling at least partially within a passband of the filter, and determines that the at least one other channel is active based on the at least one beacon signal.

DETAILED DESCRIPTION

Figure 1:
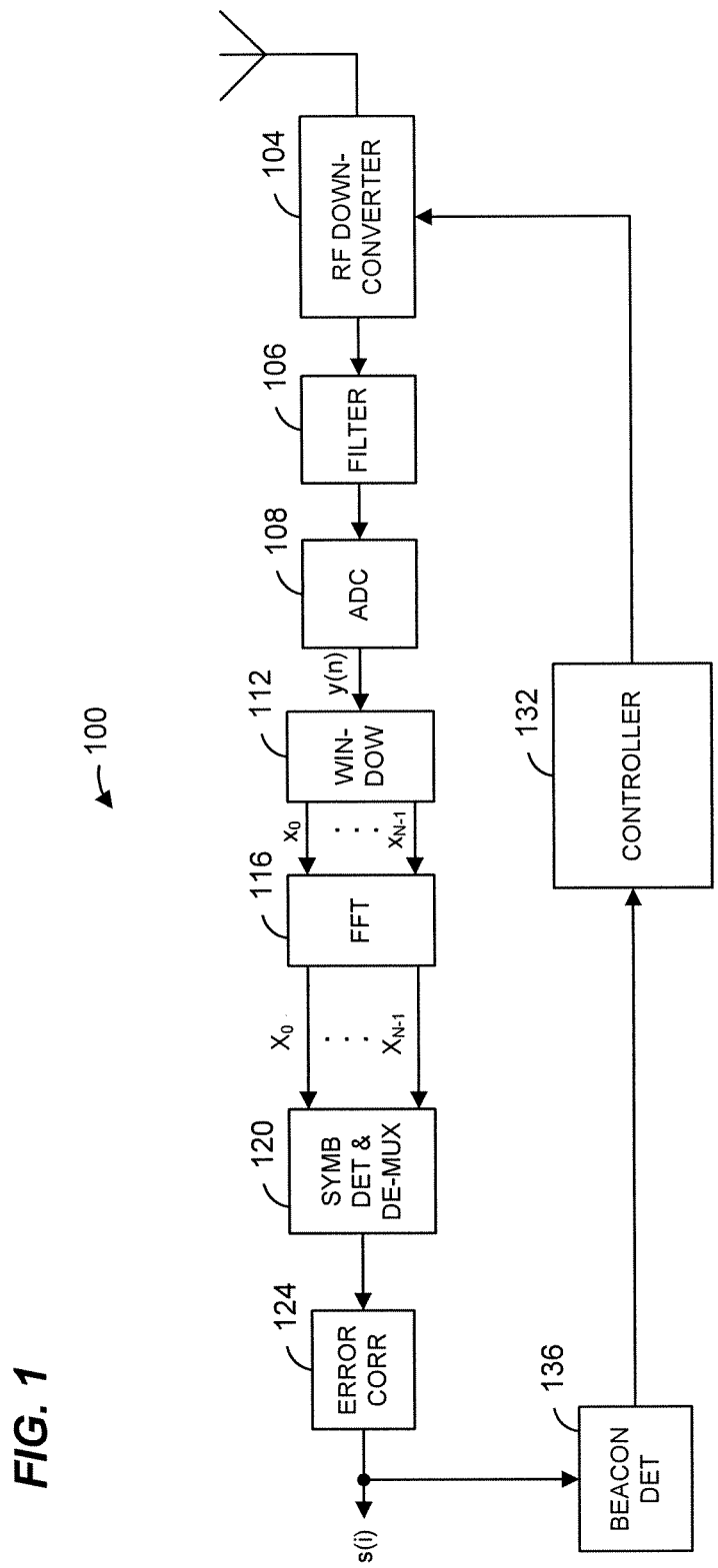
FIG. 1 is a block diagram an example receiver for use in an OFDM-based communications system.

FIG. 1 is a block diagram of an example OFDM receiver 100. The receiver 100 includes a radio frequency (RF) downconverter 104 that receives an OFDM signal that has been modulated to an RF channel and shifts the OFDM signal from the RF channel to baseband. The RF downconverter 104 may be any of a variety of types of RF downconverters including, for example, a direct conversion downconverter, a super heterodyne downconverter, etc.

A filter 106 is coupled to the RF downconverter 104 and filters an output of the RF downconverter 104. Depending on the particular implementation, the filter 106 may be a fixed filter or a tunable filter. In implementations using a super heterodyne downconverter, the filter 106 optionally may operate on an intermediate frequency (IF) as opposed to operating at baseband. The filter 106 may have a 20 MHz passband, for example, if the receiver 100 is to be compatible with the IEEE 802.11 standard. The filter 106 alternatively may have a 40 MHz passband if the receiver 100 is to support channel bonding, for example. Of course, the filter 106 may have a bandwidth that is different than 20 MHz or 40 MHz depending upon the particular implementation of the receiver 100.

An analog-to-digital converter (ADC) 108 coupled to the RF downconverter 104 (via the filter 106) samples the downconverted signal. An output (y(n)) of the ADC 108 includes signal information corresponding to OFDM symbols and signal information corresponding to guard intervals, which may include a cyclic prefix, for example. A cyclic prefix is merely a copy of an ending portion of the OFDM symbol inserted in the guard interval that precedes the OFDM symbol.

A windowing block 112 is coupled to the ADC 108 The windowing block 108 provides a block of signal samples $x_0$, $x_1$, $x_{N-1}$ to a fast Fourier transform calculation block 116 (such as a Fourier transform (FFT) block) to which the windowing block 112 is coupled. The signal samples $x_0$, $x_1$, $x_{N-1}$ correspond to an OFDM symbol. In other words, the windowing block 112 attempts to extract OFDM symbols from the signal y(n). The FFT block 116 performs an FFT operation on the set of N signal samples $x_0$, $x_1$, $x_{N-1}$ and generates a set of N signals $X_0$, $X_1$, . . . $X_{N-1}$ that correspond to the OFDM symbol. Each of the N signals $X_0$, $X_1$, . . . $X_{N-1}$ may be a quadrature amplitude modulation (QAM), phase-shift keying (PSK), etc., modulated signal. A symbol detector/de-multiplexer 120 is coupled to the FFT block 116 and maps each of the signals $X_0$, $X_1$, . . . $X_{N-1}$ to a set of one or more bits, depending on the particular modulation scheme that is employed. Additionally, the symbol detector/de-multiplexer 120 demultiplexes the parallel sets of bits to form a serial information signal s(i). The symbol detector/de-multiplexer 120 may include a Viterbi decoder. An error corrector 124 operates on the information signal s(i) and attempts to correct errors in the signal s(i).

Additionally, the receiver 100 includes a controller 132 coupled to the RF demodulator 104. The controller 132 generates a control signal that causes the RF demodulator 104 to tune to a particular RF channel. Further, the receiver 100 includes a beacon detector 136 coupled to the controller 132. The beacon detector 136 analyzes the information signal s(i) to detect beacons. When a beacon is detected, the beacon detector 136 may forward the beacon and/or information included in the beacon to the controller 132. Although in FIG. 1 the beacon detector 136 is illustrated as being separate from the controller 132, in some implementations the beacon detector may be implemented by the controller 132.

Figure 2:
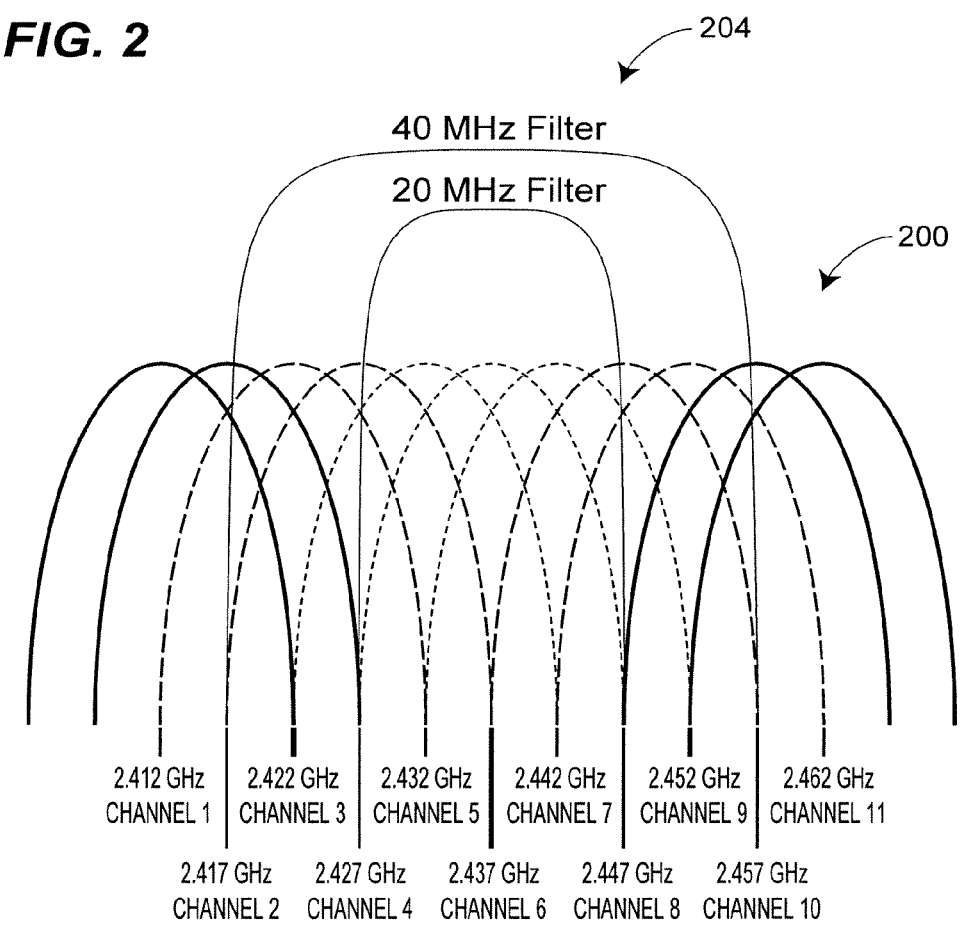
FIG. 2 is a frequency-domain diagram illustrating the locations of channels in a wireless communication network that conforms to the IEEE 802.11 standard.

FIG. 2 is a frequency-domain diagram illustrating the locations of channels 200 in a wireless communication network that conforms to the IEEE 802.11 standard. In the network corresponding to FIG. 2, there are eleven channels 200 available, and each channel 200 overlaps with adjacent channels. For example, channels 1-11 have center frequencies located approximately every 5 MHz starting at 2.412 GHz, and each channel is approximately 20 MHz wide. FIG. 2 also illustrates the frequency responses 204 of the filter 106 when the passband is approximately 20 MHz wide and when it is approximately 40 MHz wide. In FIG. 2, the passband of the filter 106 is centered at approximately 2.437 GHz which corresponds to the receiver 100 being tuned to Channel 6.

As can be seen in FIG. 2; significant portions of other channels fall within the passband of the filter 106 when the receiver 100 is tuned to Channel 6. For example, with the 20

MHz bandwidth filter 106, significant portions of Channels 5 and 7 fall within its passband. Similarly, with the 40 MHz bandwidth filter 106, significant portions of Channels 3, 4, 5, 7, 8 and 9 fall within its passband. As a result, the receiver 100 is often able to decode beacons sent on adjacent channels. Thus, the receiver 100 can scan for beacons on multiple channels while it is tuned to a single channel. Beacon signals include information indicating the channel on which it was transmitted. Therefore, the receiver 100 can analyze a beacon signal to determine via which channel the beacon was received.

Figure 3:
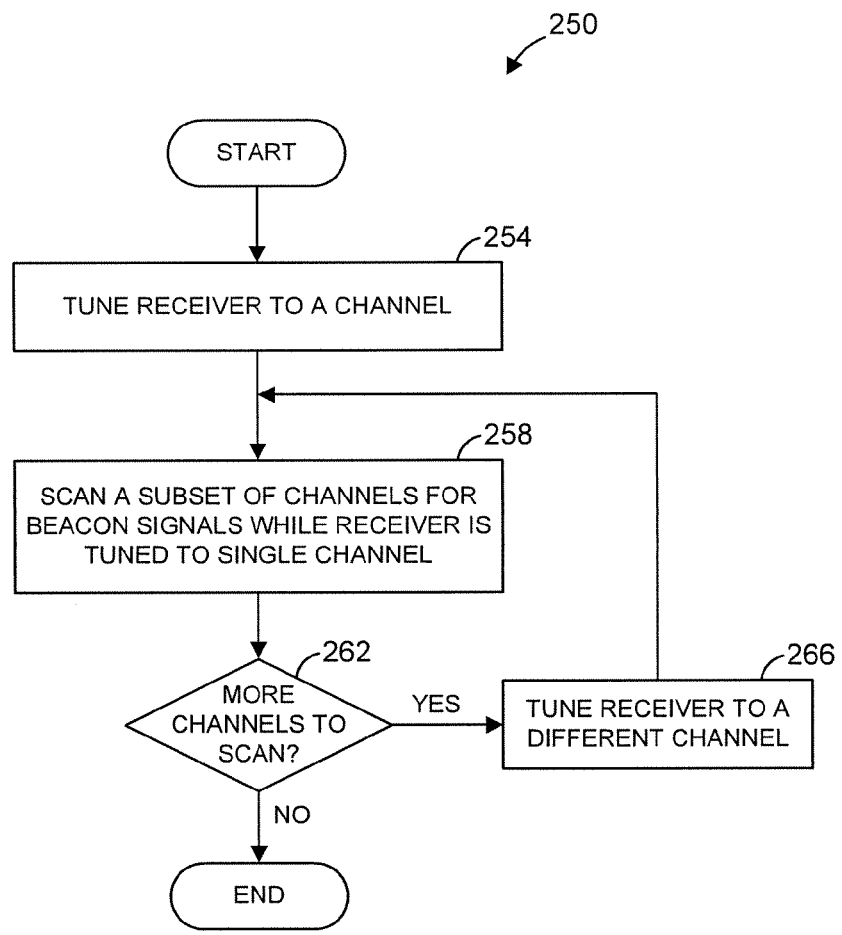
FIG. 3 is a flow diagram of an example method for scanning channels for beacons.

FIG. 3 is a flow diagram of an example method 250 for scanning channels for beacons that may be implemented by a receiver such as the example receiver 100 of FIG. 1. For ease of explanation, the method 250 will be described with reference to FIGS. 1 and 2. Of course, the method 250 may be implemented by a receiver different than the receiver 100 and in a communication network having a different set of channels as compared to the channels in FIG. 2.

At a block 254, the receiver may be tuned to a channel. For example, the controller 132 may cause the RF downconverter 104 to be tuned to a particular channel. Then, at a block 258, a subset of channels is scanned for beacons while the receiver remains tuned to a single channel. Scanning for beacons may include detecting beacons and storing in a memory indications of channels on which beacons were detected. For example, the beacon signal may include data that indicates that channel on which it was transmitted. Detecting beacons may be performed by the beacon detector 136, for example. Storing indications of channels on which beacons were detected may be performed by the controller 132. The indications may be stored in a memory of or coupled to the controller 132, for example.

Referring to FIG. 2, for example, if the receiver is tuned to Channel 6 and if the 20 MHz filter is being used, the subset of Channels 5-7 may be scanned. If the 40 MHz filter is being used, the subsets of Channels 3-9, Channels 4-8, or Channels 5-7 may be scanned, depending on the particular implementation. Scanning at the block 258 may be performed for some period greater than the interval period at which access points transmit beacons in the communication system. For example, scanning at the block 258 may be performed for a period that is between one and two beacon interval periods. As further alternative examples, scanning at the block 258 may be performed for a period that is between 1 and 1.25 beacon interval periods, 1.1 and 1.5 beacon interval periods, 1.5 and two beacon interval periods, etc. The particular period for which scanning at the block 258 may be performed may depend on the particular implementation.

At a block 262, it may be determined if there are more channels to scan. For example, determining if there are more channels may include analyzing an order or list of channels. As another example, determining if there are more channels may include adding an offset to a current channel number and determining if the sum is greater than a last channel. If there are no more channels to scan, the flow may end. Otherwise, the flow proceeds to a block 266, at which the receiver is tuned to a different channel. Determination of the different channel to which to tune the receiver may be determined in a variety of ways. For example, determining the different channel may include analyzing an order or list of channels. Also, determining the different channel may be based on a variety of factors. For example, it may be based on which channels have already been scanned. It also may be based on the channel to which the receiver is currently tuned. It also may be based on the bandwidth of the filter 106. Further, it may be based on a fixed sequence of channels or a fixed step size (e.g., next channel=current channel+step size). Next, the flow proceeds back to the block 258.

To further illustrate the method 250, specific examples will be discussed with respect to FIG. 2. These examples are set forth as tables in which the ordering of the rows corresponds to the sequence of channels to which the receiver tunes while the method 250 is implemented. For example, in Table 1, the receiver is first tuned to Channel 1, then to Channel 4, then to Channel 7, and finally to Channel 11. The second columns of the tables indicate the channels that are scanned while the receiver is tuned to a particular example. In Table 1, for example, Channels 3, 4, and 5 are scanned while the receiver is tuned to Channel 4.

Tables 1 and 2 are examples in which the receiver utilizes a filter 106 having a 20 MHz passband.

TABLE 1

| Channel to Which Receiver is Tuned | Channels Scanned |
| --- | --- |
| 1 | 1, 2 |
| 4 | 3, 4, 5 |
| 7 | 6, 7, 8 |
| 10 | 9, 10, 11 |

TABLE 2

| Channel to Which Receiver is Tuned | Channels Scanned |
| --- | --- |
| 2 | 1, 2, 3 |
| 5 | 4, 5, 6 |
| 8 | 7, 8, 9 |
| 11 | 10, 11 |

Tables 3-9 are examples in which the receiver utilizes a filter 106 having a 40 MHz passband.

TABLE 3

| Channel to Which Receiver is Tuned | Channels Scanned |
| --- | --- |
| 1 | 1, 2, 3, 4 |
| 4 | 1, 2, 3, 4, 5, 6, 7 |
| 7 | 4, 5, 6, 7, 8, 9, 10 |
| 10 | 7, 8, 9, 10, 11 |

TABLE 4

| Channel to Which Receiver is Tuned | Channels Scanned |
| --- | --- |
| 2 | 1, 2, 3, 4, 5 |
| 5 | 2, 3, 4, 5, 6, 7, 8 |
| 8 | 5, 6, 7, 8, 9, 10, 11 |
| 11 | 8, 9, 10, 11 |

TABLE 5

| Channel to Which Receiver is Tuned | Channels Scanned |
| --- | --- |
| 3 | 1, 2, 3, 4, 5, 6 |
| 6 | 3, 4, 5, 6, 7, 8, 9 |
| 9 | 6, 7, 8, 9, 10, 11 |
| 11 | 7, 8, 9, 10, 11 |

TABLE 6

| Channel to Which Receiver is Tuned | Channels Scanned |
| --- | --- |
| 1 | 1, 2, 3, 4 |
| 6 | 3, 4, 5, 6, 7, 8, 9 |
| 11 | 8, 9, 10, 11 |

TABLE 7

| Channel to Which Receiver is Tuned | Channels Scanned |
| --- | --- |
| 3 | 1, 2, 3, 4, 5, 6 |
| 8 | 5, 6, 7, 8, 9, 10, 11 |
| 11 | 8, 9, 10, 11 |

TABLE 8

| Channel to Which Receiver is Tuned | Channels Scanned |
| --- | --- |
| 3 | 1, 2, 3, 4, 5, 6 |
| 9 | 6, 7, 8, 9, 10, 11 |

TABLE 9

| Channel to Which Receiver is Tuned | Channels Scanned |
| --- | --- |
| 3 | 1, 2, 3, 4, 5, 6 |
| 8 | 5, 6, 7, 8, 9, 10, 11 |

As can be seen in the examples corresponding to Tables 1-9, if a filter with a 40 MHz passband is utilized, it may take less loops through the method 250 as compared to utilizing a filter with a 20 MHz passband because more Channels potentially can be scanned while the receiver is tuned to a single Channel.

Of course, in examples corresponding to Tables 1-9, the receiver need not be tuned in forward order (i.e., from the first row to the last row). Rather, the receiver could be tuned in reverse order (i.e., from the last row to the first row) or some other order. Referring to Table 1, as just one example, the receiver could first be tuned to Channel 4, then to Channel 1, then to Channel 11, and finally to Channel 7.

Figure 4:
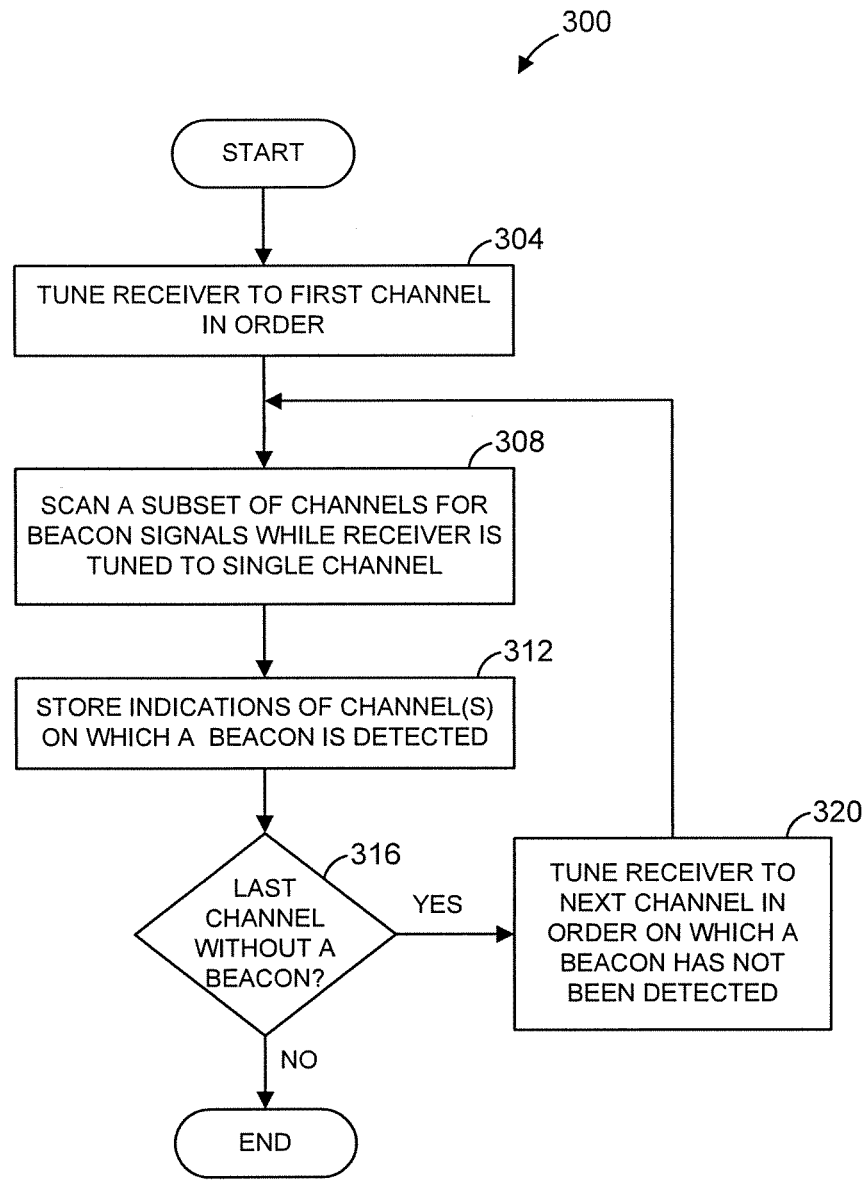
FIG. 4 is a flow diagram of a specific embodiment of the method of FIG. 3.

FIG. 4 is a flow diagram of an example method 300 for scanning channels for beacons that may be implemented by a receiver such as the example receiver 100 of FIG. 1. The method 300 is another embodiment of the method 250 of FIG. 3. For ease of explanation, the method 300 will be described with reference to FIGS. 1 and 2. Of course, the method 300 may be implemented by a receiver different than the receiver 100 and in a communication network having a different channel configuration as compared to the channels in FIG. 2.

At a block 304, a receiver may be tuned to a first channel in an order of channels. For example, the controller 132 may cause the RF downconverter 104 to tune the receiver 100 to a first channel in the order. An indication of the order may be stored in a memory that is a component of or coupled to the controller 132. Referring to FIG. 2, the order may be an ordering of the Channels 1-11. For example, the order could be Channel 1, Channel 2, . . . , Channel 11. Of course, different orderings could be utilized as well.

At a block 308, as subset of channels may be scanned while the receiver is tuned to the single channel. The block 308 may be implemented similar to the block 258 of FIG. 3, for example. At a block 312, indications of channels on which beacons were detected, if any, may be stored. For example, the controller 132 may store indications of the channels on which beacons were detected in a memory that is part of or coupled to the controller 132.

At a block 316, it may be determined if there are any channels in the order to which the receiver was not already tuned and for which a beacon has not yet been detected. If there are no such channels, the flow may end. If there are one or more such channels, the flow may proceed to a block 320.

At the block 320, the next channel in the order to which the receiver was not already tuned and for which a beacon has not yet been detected is determined and the receiver is tuned to that channel. Then, the flow returns to the block 308.

Although the methods of FIGS. 2 and 3 were described with reference to an OFDM-based system, it is to be understood that the channel scanning techniques may be used in systems that use modulation techniques other than OFDM.

Figure 5A:
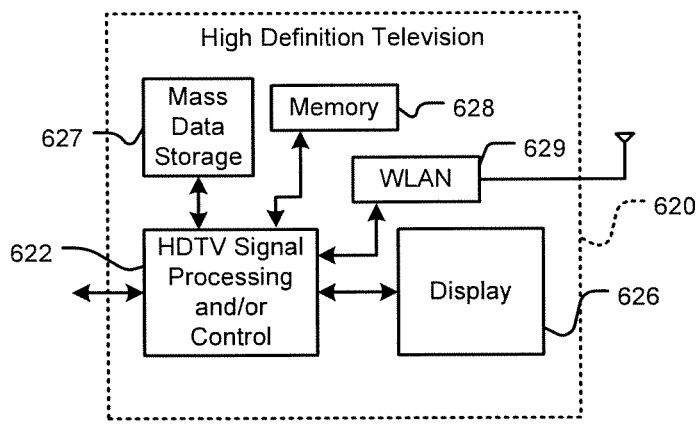
FIG. 5A is a block diagram of a high definition television that may utilize channel scanning techniques such as described herein.

Referring now to FIGS. 5A-5F, various example devices will be described that may utilize channel scanning techniques such as described above. Referring to FIG. 5A, such techniques may be utilized in a high definition television (HDTV) 620. The HDTV 620 includes signal processing and/or control circuits, which are generally identified in FIG. 5A at 622, a WLAN interface 629, and a mass data storage 627. Channel scanning techniques may be utilized in the WLAN interface 629 or the signal processing circuit and/or control circuit 622, for example. HDTV 620 receives HDTV input signals in either a wired or wireless format and generates HDTV output signals for a display 626. In some implementations, signal processing circuit and/or control circuit 622 and/or other circuits (not shown) of HDTV 620 may process data, perform coding and/or encryption, perform calculations, format data and/or perform any other type of HDTV processing that may be required.

HDTV 620 may communicate with mass data storage 627 that stores data in a nonvolatile manner such as optical and/or magnetic storage devices. The mass data storage 627 may include one or more hard disk drives (HDDs) and/or one or more digital versatile disks (DVDs). One or more of the HDDs may be a mini HDD that includes one or more platters having a diameter that is smaller than approximately 1.8". HDTV 620 may be connected to memory 628 such as RAM, ROM, low latency nonvolatile memory such as flash memory and/or other suitable electronic data storage. HDTV 620 also may support connections with a WLAN via the WLAN network interface 629.

Figure 5B:
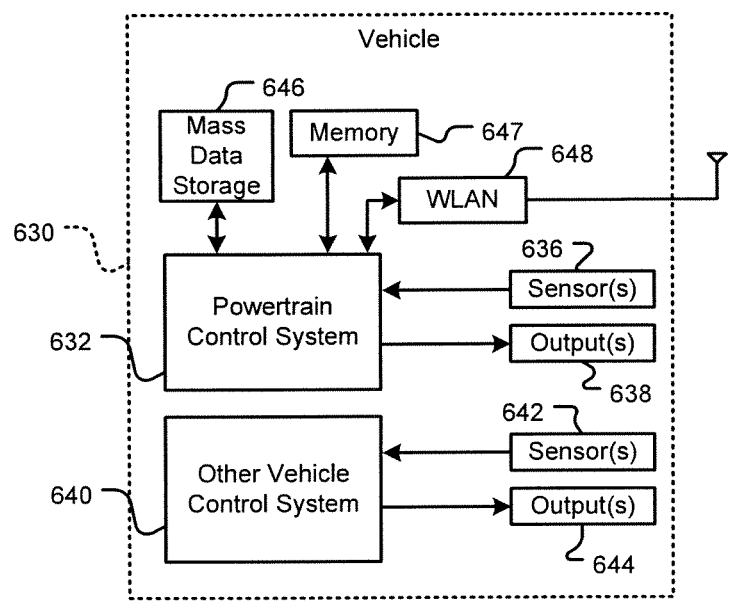
FIG. 5B is a block diagram of a vehicle that may utilize channel scanning techniques such as described herein.

Referring now to FIG. 5B, techniques such as described above may be utilized in a control system of a vehicle 630. In some implementations, a powertrain control system 632 receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

A control system 640 may likewise receive signals from input sensors 642 and/or output control signals to one or more output devices 644. In some implementations, control system 640 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 632 may communicate with mass data storage 646 that stores data in a nonvolatile manner. Mass data storage 646 may include optical and/or magnetic storage devices for example hard disk drives HDD and/or DVDs. One or more of the HDDs may be a mini HDD that includes one or more platters having a diameter that is smaller than approximately 1.8". Powertrain control system 632 may be connected to memory 647 such as RAM, ROM, low latency nonvolatile memory such as flash memory and/or other suitable electronic data storage. Powertrain control system 632 also may support connections with a WLAN via a WLAN network interface 648. Channel scanning techniques such as described above may be implemented in the WLAN interface 648. The control system 640 may also include mass data storage, memory and/or a WLAN interface (all not shown).

Figure 5C:
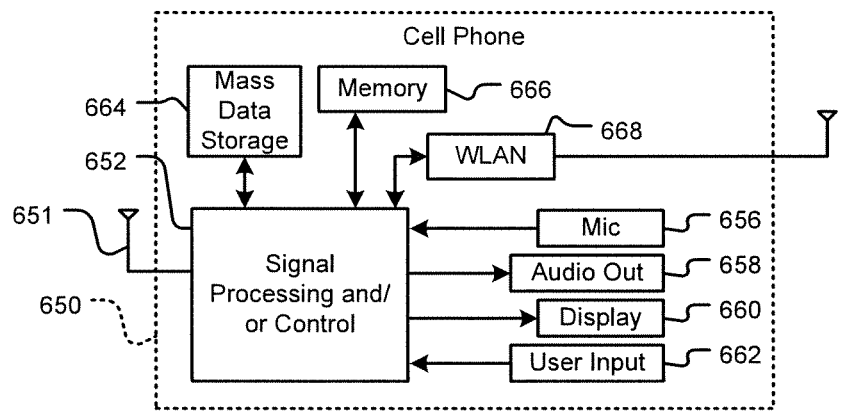
FIG. 5C is a block diagram of a cellular phone that may utilize channel scanning techniques such as described herein.

Referring now to FIG. 5C, techniques such as described above may also be utilized in a cellular phone 650 that may include a cellular antenna 651. The cellular phone 650 includes signal processing and/or control circuits, which are generally identified in FIG. 5C at 652, a WLAN interface 668, and a mass data storage 664. Channel scanning techniques may be implemented in the signal processing and/or control circuits 652 and/or the WLAN interface 668, for example. In some implementations, cellular phone 650 includes a microphone 656, an audio output 658 such as a speaker and/or audio output jack, a display 660 and/or an input device 662 such as a keypad, pointing device, voice actuation and/or other input device. Signal processing and/or control circuits 652 and/or other circuits (not shown) in cellular phone 650 may process data, perform coding and/or encryption, perform calculations, format data and/or perform other cellular phone functions.

Cellular phone 650 may communicate with mass data storage 664 that stores data in a nonvolatile manner such as optical and/or magnetic storage devices for example hard disk drives HDD and/or DVDs. At least one HDD may be a mini HDD that includes one or more platters having a diameter that is smaller than approximately 1.8". Cellular phone 650 may be connected to memory 666 such as RAM, ROM, low latency nonvolatile memory such as flash memory and/or other suitable electronic data storage. Cellular phone 650 also may support connections with a WLAN via a WLAN network interface 668.

Figure 5D:
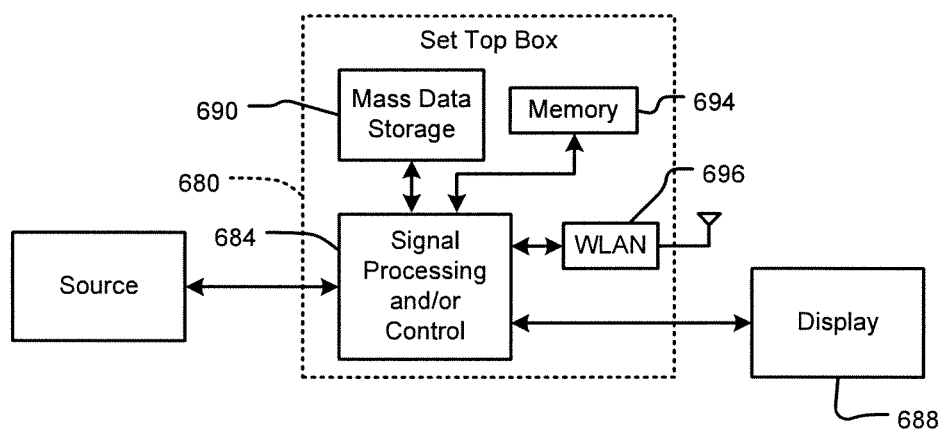
FIG. 5D is a block diagram of a set top box that may utilize channel scanning techniques such as described herein.

Referring now to FIG. 5D, techniques such as described above may be utilized in a set top box 680. The set top box 680 includes signal processing and/or control circuits, which are generally identified in FIG. 5D at 684, a WLAN interface 696, and a mass data storage device 690. Channel scanning techniques may be implemented in the signal processing and/or control circuits 684 and/or the WLAN interface 696, for example. Set top box 680 receives signals from a source such as a broadband source and outputs standard and/or high definition audio/video signals suitable for a display 688 such as a television and/or monitor and/or other video and/or audio output devices. Signal processing and/or control circuits 684 and/or other circuits (not shown) of the set top box 680 may process data, perform coding and/or encryption, perform calculations, format data and/or perform any other set top box function.

Set top box 680 may communicate with mass data storage 690 that stores data in a nonvolatile manner. Mass data storage 690 may include optical and/or magnetic storage devices for example hard disk drives HDD and/or DVDs. At least one HDD may be a mini HDD that includes one or more platters having a diameter that is smaller than approximately 1.8". Set top box 680 may be connected to memory 694 such as RAM, ROM, low latency nonvolatile memory such as flash memory and/or other suitable electronic data storage. Set top box 680 also may support connections with a WLAN via the WLAN network interface 696.

Figure 5E:
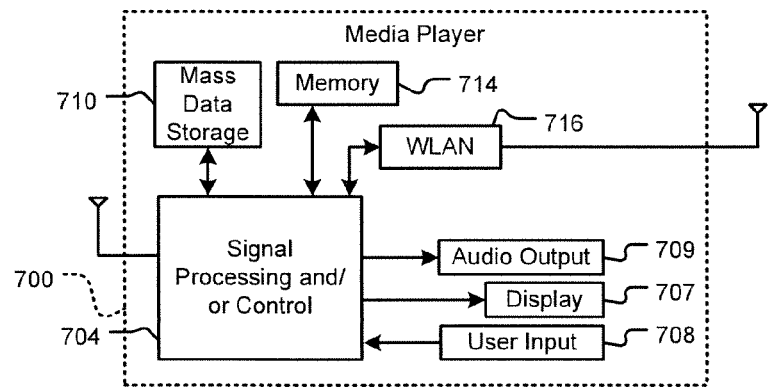
FIG. 5E is a block diagram of a media player that may utilize channel scanning techniques such as described herein.

Referring now to FIG. 5E, techniques such as described above may be utilized in a media player 700. The media player 700 may include signal processing and/or control circuits, which are generally identified in FIG. 5E at 704, a WLAN interface 716, and a mass data storage device 710. Channel scanning techniques may be implemented in the signal processing and/or control circuits 704 and/or the WLAN interface 716, for example. In some implementations, media player 700 includes a display 707 and/or a user input 708 such as a keypad, touchpad and the like. In some implementations, media player 700 may employ a graphical user interface (GUI) that typically employs menus, drop down menus, icons and/or a point-and-click interface via display 707 and/or user input 708. Media player 700 further includes an audio output 709 such as a speaker and/or audio output jack. Signal processing and/or control circuits 704 and/or other circuits (not shown) of media player 700 may process data, perform coding and/or encryption, perform calculations, format data and/or perform any other media player function.

Media player 700 may communicate with mass data storage 710 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may be a mini HDD that includes one or more platters having a diameter that is smaller than approximately 1.8". Media player 700 may be connected to memory 714 such as RAM, ROM, low latency nonvolatile memory such as flash memory and/or other suitable electronic data storage. Media player 700 also may support connections with a WLAN via a WLAN network interface 716. Still other implementations in addition to those described above are contemplated.

Figure 5F:
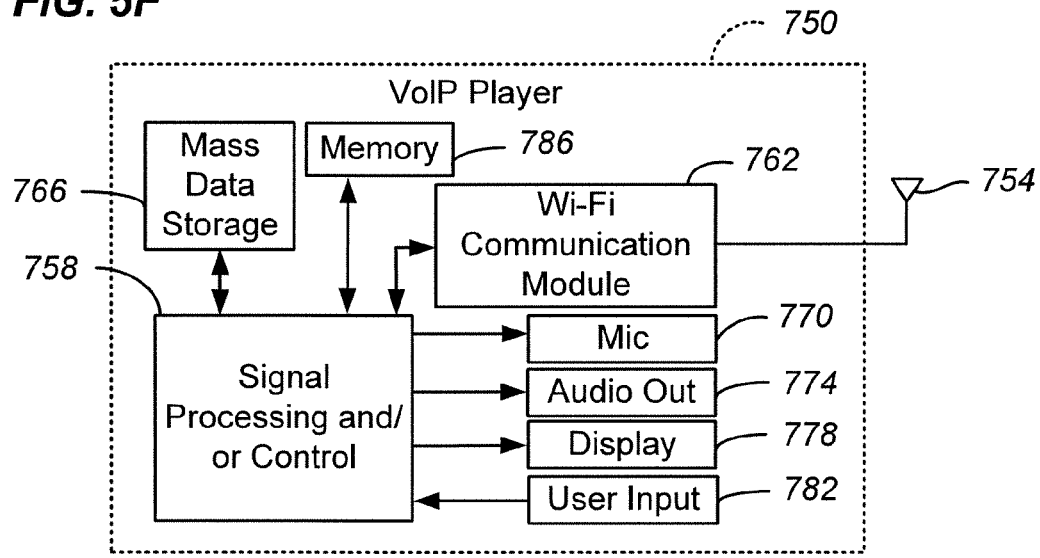
FIG. 5F is a block diagram of a voice over IP device that may utilize channel scanning techniques such as described herein.

Referring to FIG. 5F, techniques such as described above may be utilized in a Voice over Internet Protocol (VoIP) phone 750 that may include an antenna 754, signal processing and/or control circuits 758, a wireless interface 762, and a mass data storage 766. Channel scanning techniques described above may be implemented in the signal processing and/or control circuits 758 and/or the wireless interface 762, for example. In some implementations, VoIP phone 750 includes, in part, a microphone 770, an audio output 774 such as a speaker and/or audio output jack, a display monitor 778, an input device 782 such as a keypad, pointing device, voice actuation and/or other input devices, and a Wireless Fidelity (Wi-Fi) communication module 762. Signal processing and/or control circuits 758 and/or other circuits (not shown) in VoIP phone 750 may process data, perform coding and/or encryption, perform calculations, format data and/or perform other VoIP phone functions.

VoIP phone 750 may communicate with mass data storage 766 that stores data in a nonvolatile manner such as optical and/or magnetic storage devices, for example hard disk drives HDD and/or DVDs. The HDD may be a mini HDD that includes one or more platters having a diameter that is smaller than approximately 1.8". VoIP phone 750 may be connected to memory 786, which may be a RAM, ROM, low latency nonvolatile memory such as flash memory and/or other suitable electronic data storage. VoIP phone 750 is configured to establish communications link with a VoIP network (not shown) via Wi-Fi communication module 762.

The various blocks, operations, and techniques described above may be implemented in hardware, firmware, software, or any combination of hardware, firmware, and/or software. When implemented in software, the software may be stored in any computer readable memory such as on a magnetic disk, an optical disk, or other storage medium, in a RAM or ROM or flash memory of a computer, processor, hard disk drive, optical disk drive, tape drive, etc. Likewise, the software may be delivered to a user or a system via any known or desired delivery method including, for example, on a computer readable disk or other transportable computer storage mechanism or via communication media. Communication media typically embodies computer readable instructions, data structures, program modules or other data in a modulated data signal such as a carrier wave or other transport mechanism. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, radio frequency, infrared and other wireless media. Thus, the software may be delivered to a user or a system via a communication channel such as a telephone line, a DSL line, a cable television line, a wireless communication channel, the Internet, etc. (which are viewed as being the same as or interchangeable with providing such software via a transportable storage medium). When implemented in hardware, the hardware may comprise one or more of discrete components, an integrated circuit, an application-specific integrated circuit (ASIC), etc.

While the present invention has been described with reference to specific examples, which are intended to be illustrative only and not to be limiting of the invention, it will be apparent to those of ordinary skill in the art that changes, additions or deletions in addition to those explicitly described above may be made to the disclosed embodiments without departing from the spirit and scope of the invention.

What is claimed is:

1. A method, comprising:
   tuning a wireless local area network (WLAN) receiver to a first channel of a plurality of channels;
   receiving at least one WLAN beacon signal from at least one other channel of the plurality of channels while the WLAN receiver is tuned to the first channel, including decoding the at least one WLAN beacon signal received while the WLAN receiver is tuned to the first channel; and
   while the WLAN receiver is tuned to the first channel, determining the identity of the at least one other channel by analyzing information in the decoded WLAN beacon signal.

2. A method according to claim 1, wherein the plurality of channels includes N channels, wherein N is an integer greater than three;
   wherein the method further comprises scanning all N channels by tuning the receiver to M channels, wherein M is an integer less than N.

3. A method according to claim 1, wherein the receiver includes a filter with a passband having a 20 MHz bandwidth;
   wherein receiving at least one beacon signal from at least one other channel comprises receiving at least one beacon signal from at least one other channel in a subset of at least two channels, the subset including the first channel.

4. A method according to claim 3, wherein the subset includes three channels.

5. A method according to claim 1, wherein the receiver includes a filter with a passband having a 40 MHz bandwidth;
   wherein receiving at least one beacon signal from at least one other channel comprises receiving at least one beacon signal from at least one other channel in a subset of at least five channels, the subset including the first channel.

6. A method according to claim 5, wherein the subset includes seven channels.

7. A method according to claim 5, wherein receiving at least one beacon signal comprises receiving a beacon signal modulated using OFDM.

8. A method according to claim 1, further comprising determining that the at least one other channel is active, including determining that an access point in a communication network is able to communicate via the at least one other channel.

9. A method, comprising:
   tuning a wireless local area network (WLAN) receiver to a first channel, the first channel in a first subset of channels;
   scanning the first subset of channels for one or more WLAN beacon signals while the WLAN receiver is tuned to the first channel, including,
      when a WLAN beacon signal from a channel adjacent to the first channel is received while the WLAN receiver is tuned to the first channel, decoding the WLAN beacon signal from the channel adjacent the first channel;
   tuning the WLAN receiver to a second channel, the second channel in a second subset of channels different than the first subset of channels;
   scanning the second subset of channels for one or more WLAN beacon signals while the WLAN receiver is tuned to the second channel;
   decoding the one or more WLAN beacon signals to determine via which one of the scanned second subset of channels the one or more WLAN beacon signals are received while the WLAN receiver is tuned to the second channel, including,
      when a WLAN beacon signal from a channel adjacent to the second channel is received while the WLAN receiver is tuned to the second channel, i) decoding the WLAN beacon signal from the channel adjacent the second channel and ii) determining the identity of the channel adjacent to the second channel by analyzing information in the decoded WLAN beacon signal.

10. A method according to claim 9, wherein the first subset of channels and the second subset of channels include one or more of the same channels.

11. A method according to claim 9, wherein the first subset of channels and the second subset of channels do not include any of the same channels.

12. A method according to claim 9, wherein multi-channel communication system includes N channels, wherein N is an integer greater than three;
    wherein the method further comprises scanning all N channels by tuning the receiver to M channels, wherein M is an integer less than N.

13. A method according to claim 9, wherein the receiver includes a filter with a passband having a 20 MHz bandwidth;
    wherein the first subset includes at least two channels; and
    wherein the second subset includes at least two channels.

14. A method according to claim 13, wherein the first subset includes three channels and the second subset includes three channels.

15. A method according to claim 9, wherein the receiver includes a filter with a passband having a 40 MHz bandwidth;
wherein the first subset includes at least five channels; and
wherein the second subset includes at least five channels.

16. A method according to claim 15, wherein the first subset includes seven channels and the second subset includes seven channels.

17. A method according to claim 9, wherein scanning the first subset of channels includes receiving a beacon signal modulated using OFDM; and
wherein scanning the second subset of channels includes receiving a beacon signal modulated using OFDM.

18. In a multi-channel communication system having N communication channels, wherein N is a positive integer greater than two, a method for searching for active channels, the method comprising:
tuning a WLAN receiver to each of M communication channels, wherein M is a positive integer less than N;
scanning-all N communication channels for one or more WLAN beacon signals without tuning the WLAN receiver to all N communication channels, including, when the WLAN receiver is tuned to a first channel and a WLAN beacon signal from a second channel is received, decoding the WLAN beacon signal from the second channel while the WLAN receiver is tuned to the first channel; and
while the WLAN receiver is tuned to the first channel, analyzing information in the decoded WLAN beacon signal to determine the identity of the second channel.

19. A communication device, comprising:
a radio frequency (RF) WLAN receiver having a filter;
a controller coupled to the RF WLAN receiver, the controller to
cause the WLAN receiver to be tuned to a first channel in a plurality of channels,
detect at least one WLAN beacon signal from at least one other channel while the WLAN receiver is tuned to the first channel, the at least one other channel falling partially within a passband of the filter, and
determine the identity of the at least one other channel falling partially within the passband of the filter based on decoding the at least one WLAN beacon signal while the WLAN receiver is tuned to the first channel, wherein determining the identity of the at least one other channel includes analyzing information in the decoded WLAN beacon signal.

20. A communication device according to claim 19, wherein the controller is configured to determine that an access point in a communication network is able to communicate via the at least one other channel.

* * * * *